(12) United States Patent
Pommerenke

(10) Patent No.: US 7,397,266 B2
(45) Date of Patent: Jul. 8, 2008

(54) SYSTEM AND METHOD FOR TESTING THE ELECTROMAGNETIC SUSCEPTIBILITY OF AN ELECTRONIC DISPLAY UNIT

(75) Inventor: David J. Pommerenke, Rolla, MO (US)

(73) Assignee: Amber Precision Instuments, Inc, Santa Clara, CA (US)

( * ) Notice: Subject to any disclaimer, the term of this patent is extended or adjusted under 35 U.S.C. 154(b) by 0 days.

(21) Appl. No.: 11/581,908

(22) Filed: Oct. 16, 2006

(65) Prior Publication Data

US 2008/0088336 A1    Apr. 17, 2008

(51) Int. Cl.
*G01R 31/00* (2006.01)
(52) U.S. Cl. ........................ 324/770; 324/456
(58) Field of Classification Search ................. 324/770, 324/765, 751, 456, 628
See application file for complete search history.

(56) References Cited

U.S. PATENT DOCUMENTS 5,982,190 A * 11/1999 Toro-Lira .................. 324/770
6,285,207 B1 * 9/2001 Listwan ..................... 324/770
2005/0174140 A1 * 8/2005 Iwasaki ..................... 324/770

OTHER PUBLICATIONS

Kai Wang, Dr. Pommerenke, Jian Min, Zhang, Ranachandran Chundru, "The PCB level ESD immunity study by using 3 Dimension ESD Scan System", IEEE International Symposium om EMC, Aug. 2004, pp. 343-348.
David Pommerenke, Jayong Koo, Giorgi Muchaidze, "Finding the root cause of an ESC upset event", DesignCon 2006, Santa Clara, CA, Feb. 2006.

* cited by examiner

*Primary Examiner*—Vinh P. Nguyen
(74) *Attorney, Agent, or Firm*—Thomas H. Ham; Wilson & Ham

(57) ABSTRACT

A system and method for testing the electromagnetic (EM) susceptibility of an electronic display unit monitors the light emitted from the electronic display unit as EM noise is applied at a particular testing location of the electronic display unit. An error in the electronic display unit caused by the EM noise is detected using an electrical signal generated in response to the light from the electronic display unit.

19 Claims, 5 Drawing Sheets

SYSTEM AND METHOD FOR TESTING THE ELECTROMAGNETIC SUSCEPTIBILITY OF AN ELECTRONIC DISPLAY UNIT

BACKGROUND OF THE INVENTION

Sophisticated electronic flat panel display units, such as plasma display units, liquid crystal display (LCD) units and organic light-emitting diode (OLED) display units, are susceptible to electromagnetic (EM) disturbances, such as electrostatic discharge (ESD). ESD can cause both hard errors and soft errors in electronic display units. ESD-related hard-errors in electronic display units are errors caused by physical damage of one or more electronic components of the electronic display units, while ESD-related soft errors are errors caused by incorrect signals or data in the electronic display units. ESD-related soft errors in electronic display units include bit errors, upsets, unwanted resets etc.

Currently, there are no viable tools to locate specific areas of an electronic flat panel display unit that are susceptible to EM disturbances, such as ESD. However, electronic flat panel display units are routinely tested for ESD immunity to determine whether the display units comply with applicable International Electrotechnical Commission (IEC) standards. Conventional ESD testing involves subjecting an equipment under test (EUT) to ESD using a manual ESD gun, which simulates ESD from a human or other ESD source. Using the manual ESD gun, ESD is applied to different areas of an EUT to determine whether that EUT meets the applicable IEC standards.

A significant limitation of the conventional ESD testing is that, if a flat panel display unit fails the ESD testing, the ESD test results do not provide any meaningful information on how to improve the design of that flat panel display unit with respect to ESD immunity. Thus, the ESD test results cannot be used to solve the ESD problems of that flat panel display unit.

In view of the above limitation of conventional ESD testing, there is a need for a system and method for testing the EM susceptibility, such as ESD susceptibility, of an electronic flat panel display unit to improve the design of the display unit.

SUMMARY OF THE INVENTION

A system and method for testing the electromagnetic (EM) susceptibility of an electronic display unit monitors the light emitted from the electronic display unit as EM noise is applied at a particular testing location of the electronic display unit. An error in the electronic display unit caused by the EM noise is detected using an electrical signal generated in response to the light from the electronic display unit. Different types of EM noise can be applied to different testing locations of the electronic display to determine vulnerable areas of the electronic display to the different types of EM noise.

An EM testing system in accordance with an embodiment of the invention comprises a probe, a probe positioning mechanism, an optical detector and a processing device. The probe is configured to generate EM noise in response to a drive signal. The probe positioning mechanism is configured to move the probe to different testing locations of an electronic display unit. The noise generator is electrically connected to the probe to generate the drive signal. The optical detector is positioned to monitor light emitted from the electronic display unit. The optical detector is configured to generate an electrical signal in response to the light from the electronic display unit. The processing device is operably connected to the optical detector to receive the electrical signal. The processing device is configured to detect an error in the electronic display unit caused by the EM noise using the electrical signal.

A method for testing the EM susceptibility of an electronic display unit in accordance with an embodiment of the invention comprises activating the electronic display unit such that the electronic display unit emits light, positioning a probe over a testing location of the electronic display unit, applying EM noise at the testing location of the electronic display unit using the probe, monitoring the light emitted from the electronic display unit, including generating an electrical signal in response to the light from the electronic display unit as the EM noise is applied to the electronic display unit, and detecting an error in the electronic display unit caused by the EM noise using the electrical signal.

Other aspects and advantages of the present invention will become apparent from the following detailed description, taken in conjunction with the accompanying drawings, illustrated by way of example of the principles of the invention.

DETAILED DESCRIPTION

Figure 1:
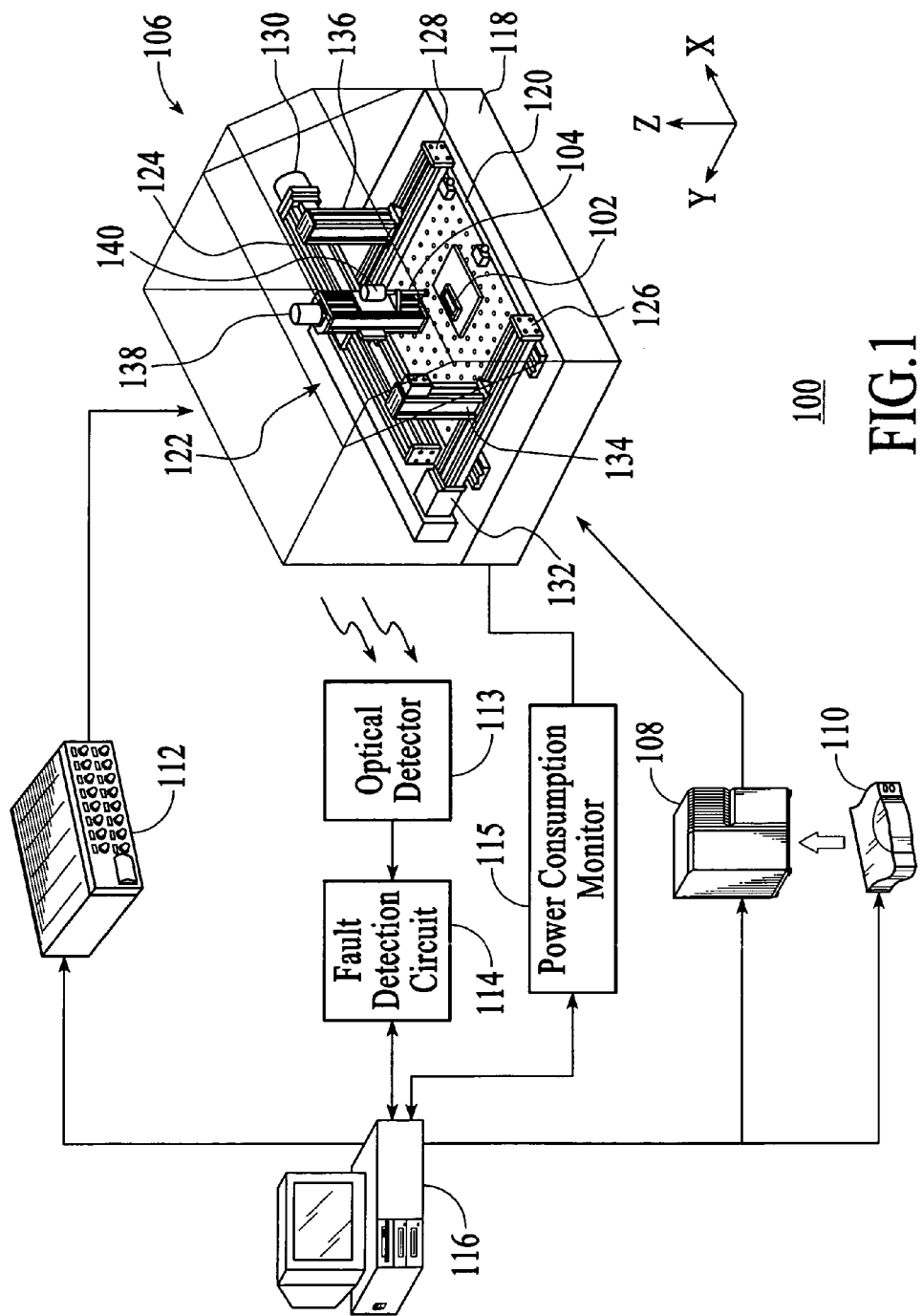
FIG. 1 is a diagram of an electromagnetic (EM) testing system in accordance with an embodiment of the invention.

With reference to FIG. 1, a system 100 for testing the electromagnetic (EM) susceptibility of an electronic flat panel display unit 102, which is the equipment under test (EUT), in accordance with an embodiment of the invention is described. The EUT 102 can be any type of a flat panel display, such as a plasma display unit, a liquid crystal display (LCD) unit or an organic light-emitting diode (OLED) display unit. The EM testing system 100 is designed to subject the EUT 102 to EM noise at various testing locations of the EUT to extract EM susceptibility information to determine vulnerable areas of the EUT with respect to EM noise. The EM susceptibility information may be used to produce an EM susceptibility map of the EUT 102. The EM susceptibility map can then be used to address the EM vulnerable areas of the EUT 102 to reduce the EM susceptibility of the EUT. Thus, using the EM testing system 100, electronic flat panel display units with improved performance can be produced.

Figure 2:
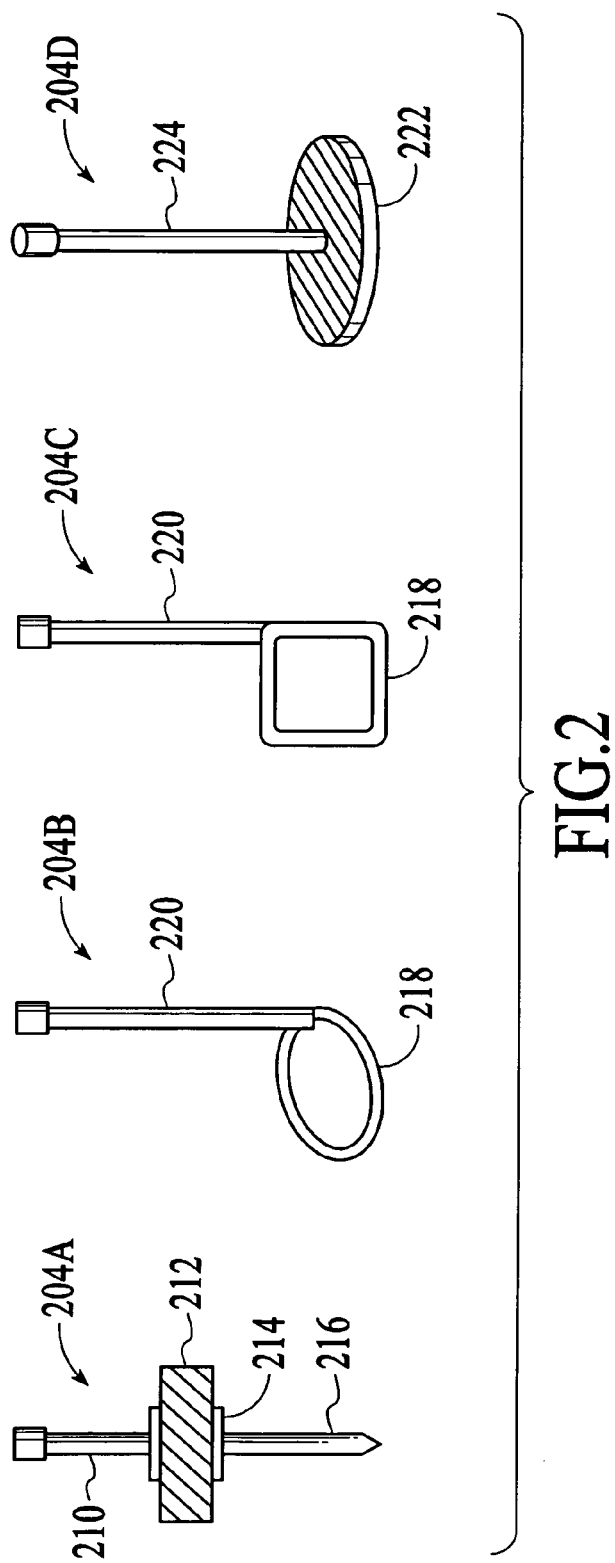
FIG. 2 is a diagram of different types of probes that can be used in the EM testing system of FIG. 1 in accordance with an embodiment of the invention.

As shown in FIG. 1, the EM testing system 100 includes a probe 104, a probe positioning mechanism 106, an EM noise generator 108, a high voltage supply 110, a motor driver 112, an optical detector 113, a fault detection circuit 114, a power consumption monitor 115 and a processing device 116. The probe 104 is designed to emit EM noise, such as electrostatic discharge (ESD), magnetic field noise and/or electric field noise, when supplied with a drive signal, such as a high current pulse. Turning now to FIG. 2, different types of probes 204A, 204B, 204C and 204D that can be used in the EM testing system 100 are shown. The probe 204A is a direct injection probe, which is composed of a coaxial cable 210, a printed circuit board (PCB) 212, a shunt capacitor 214 made from the upper layer and the lower layer of the PCB and a pogo pin 216 connected to the lower layer of the PCB. The pogo pin 216 is used to inject current directly into different electrical elements of the EUT 102, such as traces and pins on the EUT. The probes 204B and 204C are magnetic (H) field probes, which are composed of a small loop 218 attached to a semi-rigid cable (a loop antenna) 220. The loop antenna 218 of the 204B is perpendicular to the semi-rigid cable 220. However, the loop antenna 218 of the 204C is parallel to the semi-rigid cable 220. The H field probes 204B and 204C simulate the transient ESD magnetic field. The size of the loop antenna 218 of the H field probe 204B or 204C can be varied to change the area size of the EUT 102 being tested. That is, a smaller loop antenna can be used to localize the EUT area of interest. The probe 204D is an electric (E) field probe, which is one electrode 222 of a high voltage capacitor attached to a cable 224. The E field probe 204D may also include a resistor (not shown) connected to the cable 224 if the EM noise generator 108, which provides the drive signal to the probe, needs a ground return. Similar to the H field probes 204B and 204C, the size of the capacitor 222 of the E field probe 204D can be varied to change the EUT area being tested. Although specific probes 204A, 204B, 204C and 204D have been described, the probe positioning mechanism 106 is not limited to these probes, and thus, may use other types of probes that can emit EM noise when supplied with a drive signal.

The probe positioning mechanism 106 of the EM testing system 100 is designed to position the probe 104 to different testing locations of the EUT 102 so that the probe can introduce EM noise to these testing locations of the EUT. As shown in FIG. 1, the probe positioning mechanism 106 includes a base 118, a scanning plate 120, a scan head 122, linear tracks 124, 126 and 128, motors 130 and 132 and connecting structures 134 and 136. The base 118 provides structural support for other components of the probe positioning mechanism 106. The scanning plate 120 is attached to the base 118. The scanning plate 120 provides a surface on which the EUT 102 is placed for testing. The scan head 122 is configured to hold the probe 104 and to raise and lower the probe along the Z-axis, as indicated in FIG. 1, so that the probe can contact or be positioned above a desired testing location of the EUT 102. The scan head 122 is also configured to rotate the probe 104 about the Z-axis so that the direction of EM noise, for example, H field noise, from the probe can be changed. The scan head 122 includes a motor 138 to vertically displace the probe 104 along the Z-axis and a motor 140 to rotate the probe about the Z-axis. The scan head 122 is operably connected to the linear track 124, which is aligned with the X-axis, as indicated in FIG. 1. The motor 130 is attached to the track 124 to linearly displace the scan head 122 along the X-axis. Thus, the motor 130 controls the linear displacement of the probe 104, which is attached to the scan head 122, along the X-axis. The track 124 is attached to the connecting structures 134 and 136, which are operably connected to the linear tracks 126 and 128. The linear tracks 126 and 128 are attached to the base 118 and are aligned with the Y-axis, as indicated in FIG. 1. The motor 132 is attached to the track 126 to linearly displace the connecting structures 134 and 136, the track 124 and the scan head 122 along the Y-axis. Thus, the motor 132 controls the linear displacement of the probe 104, which is attached to the scan head 122, along the Y-axis. Consequently, the probe positioning mechanism 106 is enabled to move the probe 104 along the X-axis, the Y-axis and the Z-axis, and to rotate the probe about the Z-axis.

The motor driver 112 of the EM testing system 100 is designed to provide driving signals to the probe positioning mechanism 106 so that the probe 104 can be displaced to desired testing locations of the EUT 102 and be rotated to desired rotational positions. The motor driver 112 is electrically connected to the motors 130 and 132 of the probe positioning mechanism 106 to provide driving signals to these motors so that the probe 104 can be linearly displaced along the X-axis and the Y-axis. The motor driver 112 is also electrically connected to the motors 138 and 140 of the scan head 122 to provide driving signals to these motors so that the probe 104 can be vertically moved along the Z-axis and be rotated about the Z-axis.

The EM noise generator 108 of the EM testing system 100 is designed to provide a drive signal in the form of a voltage or current pulse to the probe 104 so that the probe can generate EM noise. The EM noise generator 108 is electrically connected to the probe 104 to supply the drive signal to the probe when the probe is positioned at one of the testing locations of the EUT 102. The EM noise generator 108 can be any type of a generator that can produce the desired drive signals. In this embodiment, the EM noise generator 108 is a transmission line pulse (TLP) generator. However, in other embodiments, the EM noise generator 108 may be a different noise generator. The EM noise generator 108 is electrically connected to the high voltage supply 110, which provides the necessary supply voltage to the EM noise generator. The high voltage supply 110 may be eliminated from the EM testing system 100 if the EM noise generator 108 is a generator that does not require an external high voltage supply.

The optical detector 113 and the fault detection circuit 114 of the EM testing system 100 are designed to detect abnormal fluctuations of the light emitted by the EUT 102 when EM noise from the probe 104 is applied to a particular testing location of the EUT. The optical detector 113 is used to optically sense the intensity of light generated by the EUT 102. Thus, during EM testing, the optical detector 113 is positioned such that the photodetector is placed on or near the display of the EUT 102. In response to the light from the EUT 102, the optical detector 113 generates an electrical signal, which is proportional to the intensity of light from the EUT. In this embodiment, the optical detector 113 includes one or more photoresistors. However, in other embodiments, the optical detector 113 may include any photosensitive elements, such as photodiodes or phototransistors. The size of the optical detector 113 can be varied, depending on the display size of the EUT 102. For an example, if the EUT 102 is a small liquid crystal display (LCD) unit for a cellular phone, then the optical detector 113 should be a small detector with a correspondingly small number of photosensitive elements. However, if the EUT 102 is a large plasma display unit for a large-screen television, then the optical detector 113 should be a large photodetector with a correspondingly large number of photosensistive elements.

Figure 3:
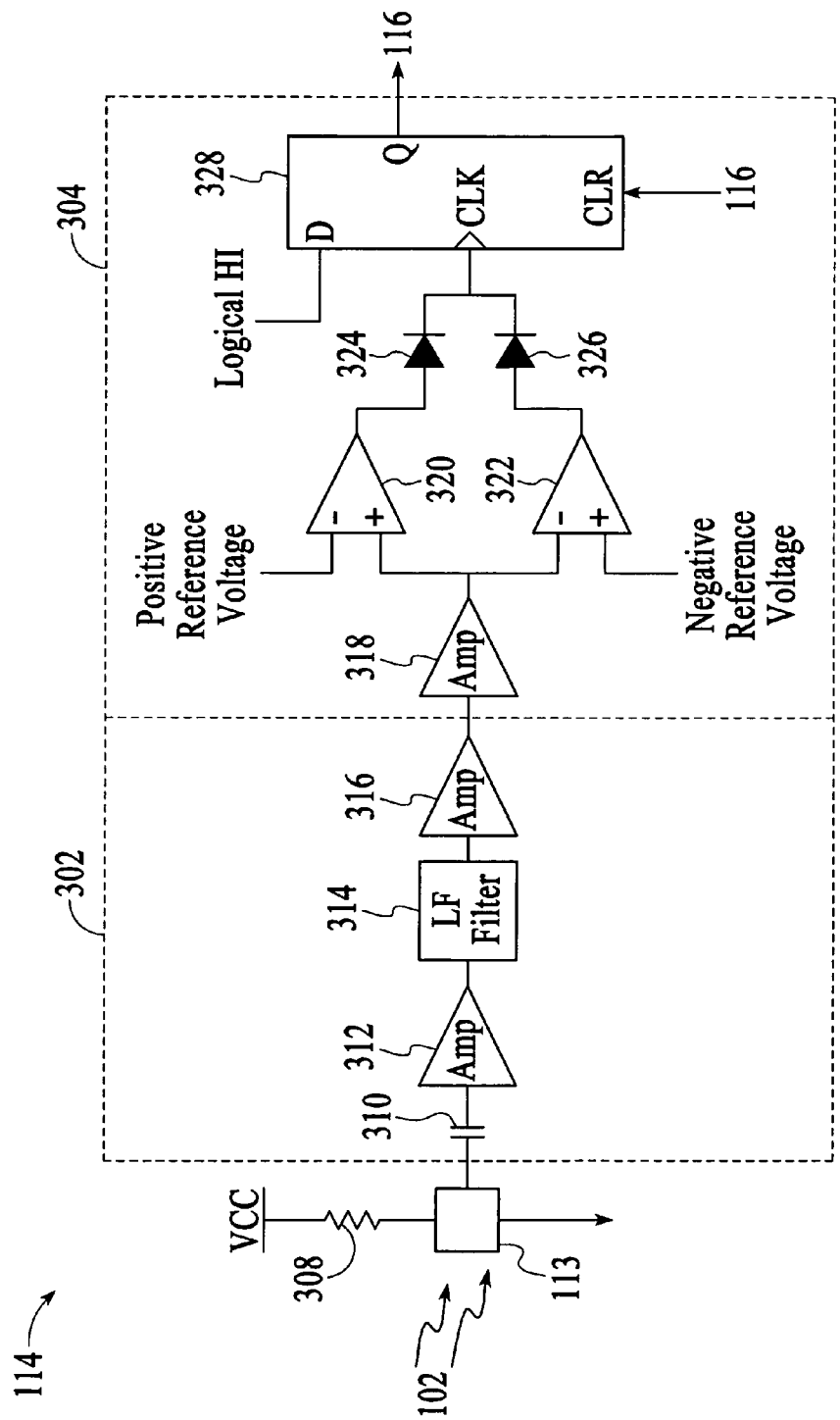
FIG. 3 is a diagram of an optical detector included in the EM testing system of FIG. 1 in accordance with an embodiment of the invention.

As illustrated in FIG. 3, the fault detection circuit 114 includes an analog section 302 and a digital section 304. The analog section 302 includes a capacitor 310, amplifiers 312 and 316 and a low frequency filter 314. As shown in FIG. 3, the optical detector 113 in the form of a photoresistor is connected to a supply voltage Vcc via a resistor 308, which provides a predefined voltage drop. The photoresistor 113 is also connected to the amplifier 312 via the capacitor 310. The amplifier 312 is connected to the low frequency filter 314, which is connected to the amplifier 316.

In operation, the resistance of the photoresistor 113 changes in response to changes in incident light from the EUT 102. The resistance change of the photoresistor 113 is reflected in an output signal, which is transmitted to the amplifier 312 through the capacitor 310. The capacitor 310 allows only the AC component of the output signal to be transmitted to the amplifier 312. The received output signal is amplified by the amplifier 312 and then filtered by the low frequency filter 314. The filtered signal is transmitted to the amplifier 316, which adjusts the gain such that the output signal can be appropriate for the digital section 304 of the fault detection circuit 114. The voltage of the output signal remains at zero when there is no change of brightness in the light from the EUT 102. However, the voltage of the output signal makes significant swings where there is a change of brightness in the light from the EUT 102.

The digital section 304 of the fault detection circuit 114 includes an amplifier 318, comparators 320 and 322, diodes 324 and 326 and a D flip flop 328. The amplifier 318 is connected to the amplifier 316 of the analog section 302 to receive the output signal of the amplifier 316. The amplifier 318 adjusts the gain necessary for the digital section 304. The output of the amplifier 318 is applied to the capacitors 320 and 322. At the comparator 320, the output signal from the amplifier 318 is compared to a positive reference voltage. If the voltage of the output signal is higher than the positive reference voltage, the comparator 320 outputs a control signal to the D flip flop 328, which is then latched to the logical high signal. Similarly, at the comparator 322, the output signal from the amplifier 318 is compared to a negative reference voltage. If the voltage of the output signal is lower than the negative reference voltage, the comparator 322 outputs a control signal to the D flip flop 328, which is then latched to the logical high signal. Thus, if the output signal from the amplifier 318 is higher than the positive reference voltage or lower than the negative reference voltage, the D flip flop 328 produces a high signal, which indicates that the brightness of the light from the EUT 102 has changed and an EUT error has occurred. Otherwise, the D flip flop 328 produces a low signal, which indicates that the brightness of the light from the EUT 102 has not changed and an EUT error has not occurred. The output signal of the D flip flop 328 is transmitted to the processing device 116. The D flip flop 328 is reset by a signal from the processing device 116.

The power consumption monitor 115 of the EM testing system 100 is designed to monitor the power consumption of the EUT 102 during testing. The power consumption monitor 115 is connected to a power line (not shown), which provides current to the EUT. The power consumption monitor 115 is configured to monitor the current flow to the EUT 102 during testing when EM noise from the probe 104 is applied to a particular testing location of the EUT. The power consumption monitor 115 is used to detect significant surge or change in the flow of current to the EUT 102, which may indicate a particular failure of the EUT. As an example, a significant increase in current to the EUT 102 may indicate a latch-up like failure. As another example, a sudden decrease in current to the EUT 102 may indicate that the EUT is dead.

The processing device 116 of the EM testing system 100 is used to control various components of the EM testing system as well as process the electrical signals from the optical detector 113 and the power consumption monitor 115 to extract EM susceptibility information of the EUT 102 from the electrical signals. The processing device 116 is electrically connected to the motor driver 112, the high supply voltage 110 and the EM noise generator 108 to provide control signals to these components of the EM testing system 100. The processing device 116 may also be electrically connected to the EUT 102 to provide control signals to the EUT to activate and reset the EUT before or during the EM testing. The processing device 116 is also electrically connected to the optical detector 113 to receive the signals generated in response to the light emitted from the EUT 102. The processing device 116 is a computer system, such as a personal computer (PC), with a program that executes a routine to automatically perform EM testing on the EUT 102. The EM testing routine is described below as part of the overall operation of the EM testing system 100.

Figure 4:
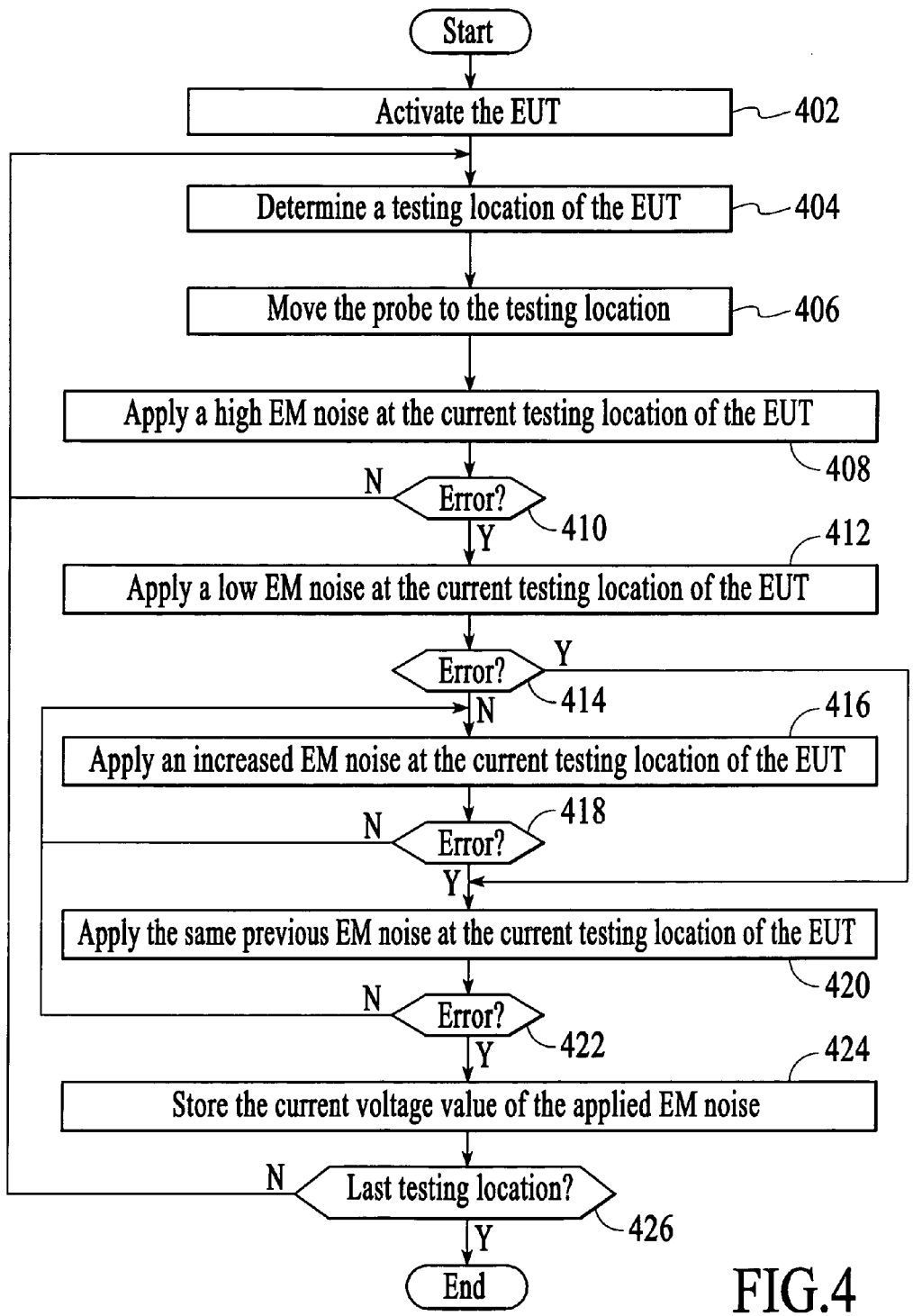
FIG. 4 is a flow diagram of the overall operation of the EM testing system of FIG. 1 in accordance with an embodiment of the invention.

The overall EM testing operation of the EM testing system 100 in accordance with an embodiment of the invention is described with reference to the flow diagram of FIG. 4. The EM testing operation begins at an optional block 402, where the processing device 116 transmits a control signal to the EUT 102 to activate the EUT, which results in the display of the EUT being illuminated. When the display of the EUT is illuminated, the optical detector 113 receives the light from the display of the EUT and generates an electrical signal in response to the received light. The electrical signal is then transmitted to the fault detection circuit 114, which produces an output signal in response to the electrical signal from the optical detector 113. Next at block 404, the processing device 116 determines a new testing location of the EUT 102. Next, at block 406, the processing device 116 transmits control signals to the probe positioning mechanism 106 to move the probe 104 to the current testing location of the EUT 102. The processing device 116 may also transmit a control signal to rotate the probe 104 about the Z-axis.

Next, at block 408, the processing device 116 transmits control signals to the high voltage supply 110 and the EM noise generator 112 to provide a driving signal using a preset high voltage pulse to the probe 104, which applies a high EM noise at the current testing location of the EUT 102. Next, at block 410, the processing device 116 determines whether the EUT 102 has experienced an error due to the applied high EM noise, which was produced using the preset high voltage pulse.

If an EUT error is detected at block 410, then the operation proceeds to block 412. However, if an EUT error is not detected at block 410, then the operation proceeds back to block 404, where the processing device 116 determines the next testing location of the EUT 102.

At block 412, the processing device 116 transmits control signals to the high voltage supply 110 and the EM noise generator 108 to provide a driving signal using a preset low voltage pulse to the probe 104, which applies a low EM noise at the current testing location of the EUT 102. Next, at block 414, the processing device 116 determines whether the EUT 102 has experienced an error due to the applied low EM noise, which was produced using the preset low voltage pulse.

If an EUT error is detected at block 414, then the operation proceeds to block 420. However, if an EUT error is not detected at block 414, then the operation proceeds to block 416.

At block 416, the processing device 116 transmits control signals to the high voltage supply 110 and the EM noise generator 108 to provide a driving signal using an increased voltage pulse with respect to the preset low voltage pulse to the probe 104, which applies an increased EM noise at the current testing location of the EUT 102. Next, at block 418, the processing device 116 determines whether the EUT 102 has experienced an error due to the applied increased EM noise, which was produced using the increased voltage pulse.

If an EUT error is detected at block 418, then the operation proceeds to block 420. At this point, the voltage of the pulse used to apply the current EM noise is assumed to be the voltage value at which an error occurs in the EUT 102. However, if an EUT error is not detected at block 414, then the operation proceeds back to block 416.

At block 420, the processing device 116 transmits control signals to the high voltage supply 110 and the EM noise generator 108 to provide the same driving signal using the same previous voltage pulse to the probe 104, which then applies the same previous EM noise at the current testing location of the EUT 102. Next, at block 422, the processing device 116 determines whether the EUT 102 has again experienced an error due to the applied EM noise. These blocks 420 and 422 are optional, and are executed to double check the voltage of the pulse at which an error occurs in the EUT 102.

If an EUT error is detected at block 422, then the operation proceeds to block 424, where the processing device 116 stores the current voltage value of the applied EM noise. However, if an EUT error is not detected at block 422, then the operation proceeds back to block 416, where another EM noise is applied to the current testing location of the EUT 102 using a further increased voltage pulse.

Next, at block 426, the processing device 116 determines whether the current testing location of the EUT 102 is the last testing location. If yes, then the operation comes to an end. If no, then the operation proceeds back to block 404, where the processing device 116 transmits control signals to the probe positioning mechanism 106 to move the probe 104 to the next testing location of the EUT 102.

In this fashion, the EM testing system 100 sequentially tests different testing locations of the EUT 102 and determines whether the EUT can withstand the applied high EM noise produced using the preset high voltage pulse. If not, then the EM testing system 100 determines the voltage value associated with the EM noise that causes an error in the EUT 102. The described operation can be repeated using different types of probes, such as the probes 204A, 204B, 204C and 204D, to test the EUT 102 for different EM noise or to localize the problem areas of the EUT.

Figure 5:
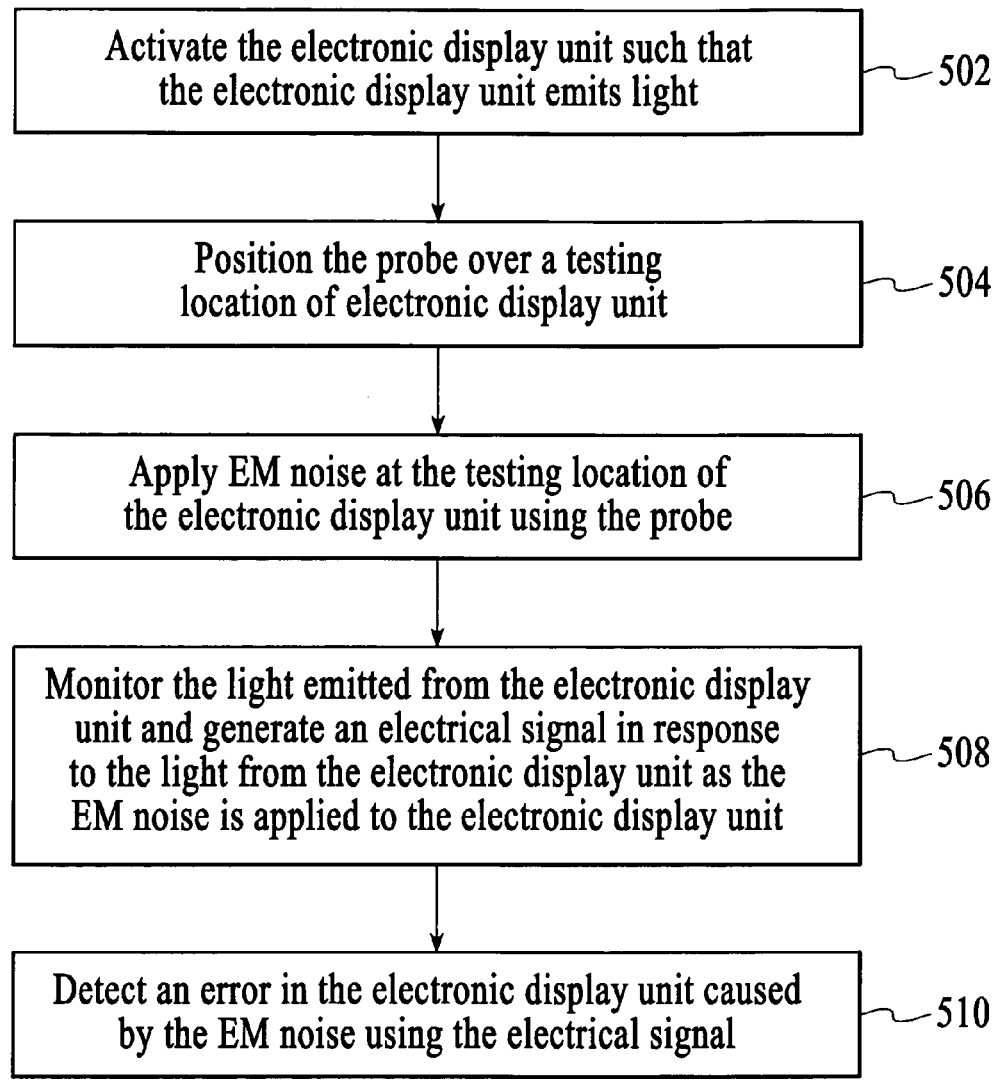
FIG. 5 is a flow diagram of a method for testing the EM susceptibility of an electronic display unit in accordance with an embodiment of the invention.

A method for testing the EM susceptibility of an electronic display unit in accordance with an embodiment of the invention is described with reference to a flow diagram of FIG. 5. At block 502, the electronic display unit is activated such that the electronic display unit emits light. Next, at block 504, a probe is positioned over a testing location of the electronic display unit. Next, at block 506, EM noise is applied at the testing location of the electronic display unit. Next, at block 508, the light emitted from the electronic display unit is monitored and an electrical signal is generated in response to the light from the electronic display unit as the EM noise is applied to the electronic display unit. Next, at block 510, an error in the electronic display unit caused by the EM noise is detected using the electrical signal.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An electromagnetic testing system comprising:
   a probe configured to generate electromagnetic noise in response to a drive signal;
   a probe positioning mechanism configured to move said probe to different testing locations of an electronic display unit;
   a noise generator electrically connected to said probe to generate said drive signal;
   an optical detector positioned to monitor light emitted from said electronic display unit, said optical detector being configured to generate an electrical signal in response to said light from said electronic display unit;
   a fault detection circuit connected to said optical detector to process said electrical signal, said fault detection circuit being configured to generate an output signal in response to changes of said electrical signal; and
   a processing device connected to said fault detection circuit to receive said output signal, said processing device being configured to detect an error in said electronic display unit caused by said electromagnetic noise using said output signal.

2. The system of claim 1 wherein said probe is configured to produce one of electric field noise and magnetic field noise.

3. The system of claim 1 wherein said probe is configured to produce electrostatic discharge.

4. The system of claim 1 wherein said optical detector includes an array of photodetectors.

5. The system of claim 4 wherein said photodetectors of said optical detector are photoresistors.

6. The system of claim 1 wherein said noise generator is a transmission line pulse generator.

7. The system of claim 1 wherein said probe positioning mechanism is configured to move said probe in a first direction and a second direction, said first and second directions being perpendicular to each other.

8. The system of claim 7 wherein said probe positioning mechanism is further configured to move said probe in a third direction, said third direction being perpendicular to said first and second directions.

9. The system of claim 8 wherein said probe positioning mechanism is further configured to rotate said probe about said third direction.

10. A method for testing the electromagnetic susceptibility of an electronic display unit, said method comprising:
    activating said electronic display unit such that said electronic display unit emits light;
    positioning a probe over a testing location of said electronic display unit;
    applying electromagnetic noise at said testing location of said electronic display unit using said probe;
    monitoring said light emitted from said electronic display unit, including generating an electrical signal in response to said light from said electronic display unit as said electromagnetic noise is applied to said electronic display unit; and
    detecting an error in said electronic display unit caused by said electromagnetic noise using said electrical signal.

11. The method of claim 10 wherein said applying said electromagnetic noise includes applying one of electric field noise and magnetic field noise at said testing location of said electronic display unit.

12. The method of claim 10 wherein said applying said electromagnetic noise includes applying electrostatic discharge at said testing location of said electronic display unit.

13. The method of claim 10 wherein said generating said electrical signal includes receiving said light from said electronic display unit at an array of photodetectors.

14. The method of claim 10 wherein said receiving said light from said electronic display unit includes receiving said light from said electronic display unit at an array of photoresistors.

15. The method of claim 10 further comprising generating a high drive pulse using a transmission line pulse generator, said high drive pulse being used to produce said electromagnetic noise.

16. The method of claim 10 wherein said positioning said probe includes moving said probe in a first direction and a second direction, said first and second directions being perpendicular to each other.

17. The method of claim 16 wherein said positioning said probe further includes moving said probe in a third direction, said third direction being perpendicular to said first and second directions.

18. The method of claim 17 wherein said positioning said probe further includes rotating said probe about said third direction.

19. The method of claim 10 further comprising:
moving said probe over a different testing location of said electronic display unit;
applying another electromagnetic noise to said different testing location of said electronic display unit using said probe;
generating another electrical signal in response to said light from said electronic display unit as said another electromagnetic noise is applied to said electronic display unit; and
detecting another error in said electronic display unit caused by said another electromagnetic noise using said another electrical signal.

* * * * *